(12) United States Patent
Kusui

(10) Patent No.: US 6,441,316 B1
(45) Date of Patent: *Aug. 27, 2002

(54) PRINTED-CIRCUIT BOARD AND A SEMICONDUCTOR MODULE, AND A MANUFACTURING PROCESS OF THE SEMICONDUCTOR MODULE

(75) Inventor: Masaaki Kusui, Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/504,712

(22) Filed: Feb. 16, 2000

(30) Foreign Application Priority Data

Aug. 27, 1999 (JP) .............................. 11-241692

(51) Int. Cl.⁷ .................................................. H05K 1/16
(52) U.S. Cl. ...................... 174/260; 174/261; 361/760; 361/768; 361/783; 257/738; 257/778
(58) Field of Search ................................. 174/260, 256, 174/258, 261, 52.4; 361/760, 764, 767, 768, 773, 774, 791, 816, 717, 783; 257/697, 738, 778, 692, 693, 774, 786

(56) References Cited

U.S. PATENT DOCUMENTS

| 4,766,268 A | * | 8/1988 | Uggowitzer | 174/256 |
| 5,519,580 A | * | 5/1996 | Natarajan et al. | 361/760 |
| 5,523,920 A | * | 6/1996 | Machuga et al. | 361/767 |
| 5,726,501 A | * | 3/1998 | Matsubara | 257/778 |
| 5,914,536 A | * | 6/1999 | Shizuki et al. | 257/778 |
| 5,973,931 A | * | 10/1999 | Fukasawa | 361/774 |
| 6,028,357 A | * | 2/2000 | Moriyama | 257/737 |
| 6,125,043 A | * | 9/2000 | Hauer et al. | 361/760 |
| 6,169,253 B1 | * | 1/2001 | Jairazbhoy et al. | 174/250 |
| 6,218,630 B1 | * | 4/2001 | Takigami | 174/261 |

FOREIGN PATENT DOCUMENTS

| JP | A951017 | 2/1997 |
| JP | A114067 | 1/1999 |

* cited by examiner

Primary Examiner—Kamand Cuneo
Assistant Examiner—I B Patel

(57) ABSTRACT

A printed-circuit board of the present invention, comprises a circuit substrate 1; a plurality of patterned wires 3 formed on a surface of said circuit substrate 1; a plurality of lands 2, each land 2 connected to at least one of said patterned wires 3 through an end portion 3a thereof; and a protection layer 6 with a plurality of openings 7, covering the surface of said circuit substrate 1, wherein said land 2 and said end portion 3a connected thereto are exposed in the associated opening 7 of said protection layer 6.

4 Claims, 6 Drawing Sheets

1: CIRCUIT SUBSTRATE
2: LAND
3: PATTERNED WIRE
3a: END PORTION OF PATTERNED WIRE
6: PHOTORESIST LAYER
7: OPENING OF PHOTORESIST LAYER

10: SOLDER PASTE LAYER

5: BALL-LIKE SOLDER

2: LAND
3: PATTERNED WIRE
3a: END PORTION OF PATTERNED WIRE
4: SEMICONDUCTOR INTEGRATED CIRCUIT
5a: PROPER SOLDERING
5b: IMPROPER SOLDERING
7: OPENING OF PHOTORESIST LAYER

1:     CIRCUIT SUBSTRATE
2:     LAND
3:     PATTERNED WIRE
3a:    END PORTION OF PATTERNED WIRE
6:     PHOTORESIST LAYER
7:     OPENING OF PHOTORESIST LAYER

PRINTED-CIRCUIT BOARD AND A SEMICONDUCTOR MODULE, AND A MANUFACTURING PROCESS OF THE SEMICONDUCTOR MODULE

BACKGROUND OF THE INVENTION

1) Technical Field of the Invention

The present invention relates to a printed-circuit board for receiving a semiconductor integrated circuit (IC) mounted thereon, and a semiconductor module including the semiconductor integrated circuit, and as well as to a manufacturing process of the semiconductor module.

2) Description of the Related Art

In the case where the IC having a plurality of pins provided with a ball-like solder or a solder bump is mounted on a circuit substrate using a packaging technology such as BGA (ball grid array) and CSP (chip scale package), the circuit substrate made of, for example, epoxy resin is provided with a plurality of isolated lands, each of which is aligned and connected, one to one correspondence, to the ball-like solder. The land, which is preformed of a film layer of, for instance, copper deposited on the circuit substrate is rounded so that it corresponds to the ball-like solder bump.

FIG. 10 shows a cross sectional view of the conventional semiconductor module receiving the IC with ball-like solders on the circuit substrate. In this drawing, the circuit substrate 1 supports a plurality of lands 2, each connected with associated wire 3. Both lands 2 and wires 3 are printed on the circuit substrate 1. The lands 2 are arrayed on the circuit substrate 1 corresponding, in number and in shape, to the ball-like solders provided on the opposing surface, i.e. the lower surface in the drawing, of the Integrated Circuit (IC) 4. Also, a protection layer 6 made of photoresist is provided on the wires 3, but not on the lands 3 to allow the lands 3 connected with ball-like solders on the IC 4.

For better understanding the problems to be solved by the present invention, FIG. 10 also shows not only ball-like solders properly fused but also that improperly fused, which are designated by numerals 5a and 5b, respectively. As shown, the properly fused ball-like solder 5a is completely soldered and thereby extends across the entire surface of the land 3. Meanwhile the improperly fused ball-like solder 5b is not completely soldered at its portion facing to the land 3, leaving a space gap extending around the land 3 between the land 3 and the fused ball-like solder 5b.

The improper soldering may bring a mal-function such as open circuit, significantly reducing the reliability of the semiconductor module 8. Thus, after soldering, a test should be made to determine whether the soldering has been performed properly. However, since a plenty of ball-like solders 5 are provided two-dimensionally between the IC 4 and the circuit substrate 1, it is difficult to determine the quality of the soldering by the visual inspection from the peripheral edge of the semiconductor module 8. Therefore, many processes for determining the quality of the soldering have been developed including a fluoroscopic test in which X-rays is illuminated from above the IC 4 to image the configuration of the fused balls, determining whether ball-like solders 5 have been properly soldered.

FIG. 11 shows, in part, a photofluorographic image of the semiconductor module 8, viewed from above thereof with a soft X-rays. As shown in an exaggerated fashion, the ball-like solders 5 can be seen more clearly due to the reduced transmissivity thereof than others, as a cross-hatched portion, which are darker than the other portions (thus, the hatching is used only for exaggeration but not for indication of a cross-section.

However, where the module 8 is designed so that the ball-like solders 5 and the lands 2 on the circuit substrate 1 have substantially the same diameter, the images of the properly fused ball-like solders 5a can be hardly distinguished from those of the improperly fused ball-like solders 5b even by the fluoroscopic test from above thereof, because both images look same configurations as shown in FIG. 11.

To solve this problem, the prior arts, such as JP-A 9-51017, and JP-A 11-4067 disclose the lands 2 designed such that they have the diameter greater than, or the configuration different from those of the ball-like solders 5.

This technique causes the reproduced image to show the configuration of the fused ball-like solders, allowing to readily judge whether the ball-like solders are properly soldered.

Disadvantageously, this requires a larger area of the lands 5 on the circuit substrate 1 therefor, which provides a great restriction in patterning the wires 3 on the circuit substrate 1. Also the larger lands 5 provides another restriction in reducing the intervals of the adjacent ball-like solders 5 in accordance with the miniaturization of IC 4 and the increase of pins, which are normally required in the highly integrated circuit.

SUMMARY OF THE INVENTION

Therefore, the present invention was made to solve the problems as aforementioned above, and the first purpose thereof is to provide a printed-circuit board, which can be easily inspected to determine the quality of the soldering when the IC with the ball-like solder of BGA, CSP or the like, is mounted on the circuit substrate, while allowing the high density mounting, even in the case where each land has approximately the same area as the ball-like solder.

Also, the second purpose of the present invention is to provide a semiconductor module which can be easily inspected to determine the quality of the soldering when the IC with the ball-like solders of BGA or CSP etc., is mounted on the circuit substrate, while allowing the high reliability and the high density mounting.

Further, the third purpose of the present invention is to provide a manufacturing process of the semiconductor module which can be easily inspected to determine the quality of the soldering when the IC with the ball-like solder of BGA, CSP or the like, is mounted on the circuit substrate, while allowing the high reliability and the high density mounting.

According to a printed-circuit board of the present invention, it comprises, a circuit substrate; a plurality of patterned wires formed on a surface of said circuit substrate; a plurality of lands, each land connected to at least one of said patterned wires through an end portion thereof; and a protection layer with a plurality of openings, covering the surface of said circuit substrate, wherein said land and said end portion connected thereto are exposed in the associated opening of said protection layer.

Also according to the printed-circuit board of the present invention, each of the end portions of said patterned wires is tapered away from one of said lands connected thereto.

According to a semiconductor module of the present invention, it comprises, a printed-circuit board, including a circuit substrate, a plurality of patterned wires formed on a surface of said circuit substrate, a plurality of lands, each land connected to at least one of said patterned wires through an end portion thereof; a semiconductor integrated circuit having a plurality of pins; and a plurality of ball-like solders formed on each of said pins to mount said semiconductor integrated circuit upon said printed-circuit board such that each of said ball-like solders is fused onto one of said lands and on the end portion of said patterned wires connected thereto.

Also according to the semiconductor module of the present invention, the printed-circuit board further including a protection layer with a plurality of openings, covering the surface of said circuit substrate; wherein each of said lands and end portions are exposed in the associated opening of said protection layer.

Further, according to the semiconductor module of the present invention, wherein each of the end portions of said patterned wires is tapered away from one of said lands connected thereto.

According to a process for manufacturing the semiconductor module of the present invention, which comprises steps of: covering an entire surface of a circuit substrate with a protection layer, wherein a plurality of patterned wires and lands are formed on said circuit substrate such that each of said patterned wires are connected at least one of said lands through an end portion thereof; opening a plurality of openings within said protection layer, each of said lands and end portions being exposed therethrough; aligning and connecting ball-like solders of a semiconductor integrated circuit to said lands; fusing said ball-like solders onto said lands and end portions of said patterned wires connected thereto, by heating the semiconductor module; and inspecting a shape of soldering by fluoroscoping the semiconductor module with a X-rays.

Also, according to the process for manufacturing the semiconductor module of the present invention, it further comprises steps of, removing said protection layer out after fusing said ball-like solders.

DETAILED DESCRIPTION OF THE PREFERRED EMBODIMENTS

Embodiment 1

Figure 1:
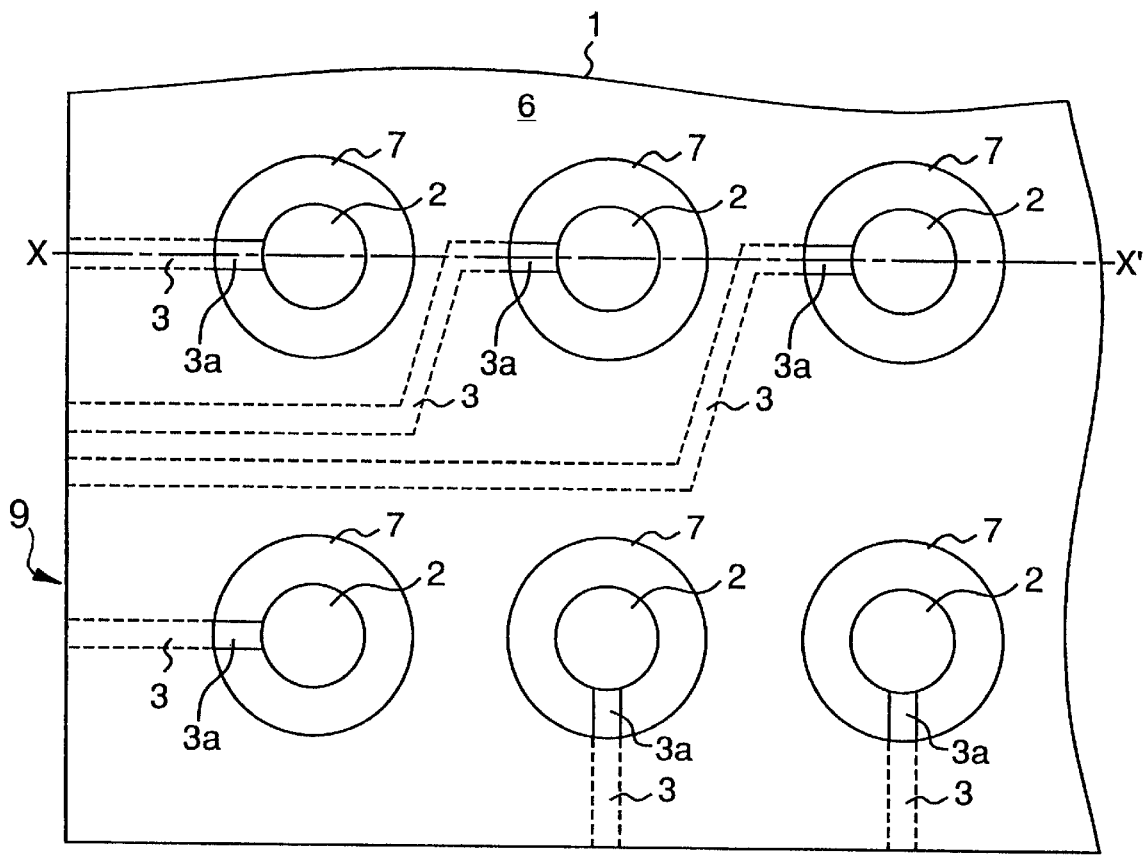
FIG. 1 is a top plan view of the printed-circuit board according to Embodiment 1 of the present invention.
Figure 2:
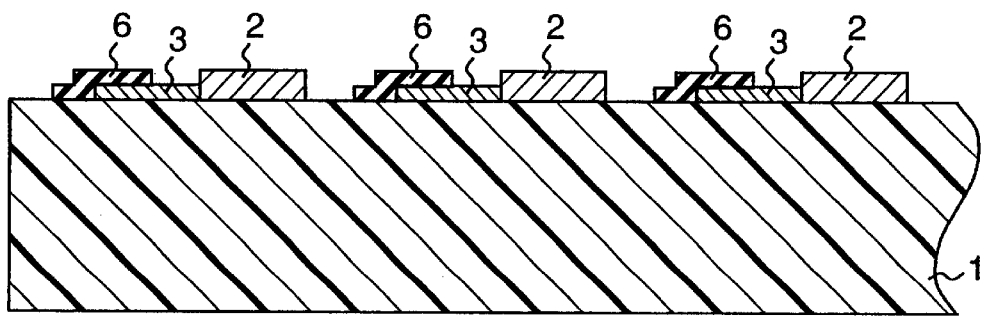
FIGS. 2 to 5 are cross sectional views each showing the manufacturing processes of the semiconductor module according to Embodiment 1 of the present invention.

Referring to FIG. 1, showing a top plan view of the printed-circuit board according to Embodiment 1 of the present invention, the printed-circuit board 9 preferably made of, for example, epoxy comprises a circuit substrate 1 supporting a plurality of lands 2 and patterned wires 3. The lands 2 are electrically connected with associated patterned wires 3. In particular, the lands 2 are arrayed on the circuit substrate 1 in the same manner as solders 5 prepared in the form of balls on an IC board 4. The printed-circuit board 9 also comprises a photoresist layer 6 for the protection of the circuits on the substrate 1. In this case, however, the lands 2 and end portions 3a of the patterned wires 3 are exposed to air for their electric connections with the associated ball-like solders 5 on the IC board 4 to form a semiconductor module 8.

FIGS. 2 to 5 show respective cross sectional views taken along lines X–X' in FIG. 1. Referring to the drawings, the details are described hereinafter with regard to the manufacturing process of the semiconductor module 8. In the process, prepared is the printed-circuit board 9 as illustrated in and described with FIG. 1, including the substrate 1 which supports the lands 2, patterned wires 3 each electrically connected to the associated lands 2, and coated photoresist layer 6.

Figure 3:
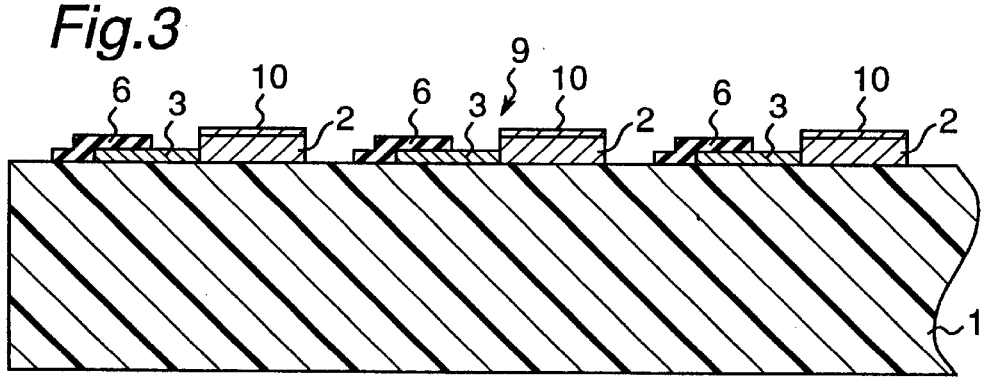

Referring to FIG. 3, the top surfaces of the lands 2 are coated with a solder paste layer 10 by the conventional printing technique.

Figure 4:
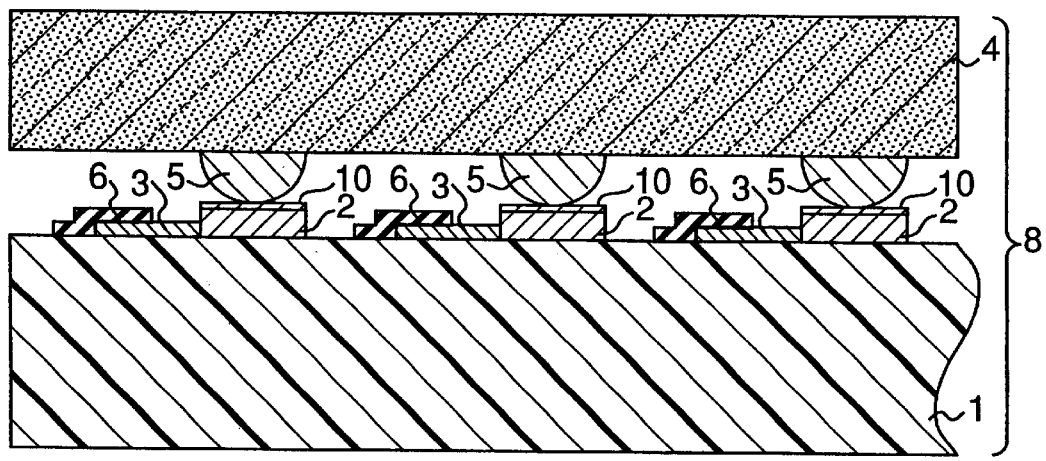

Referring next to FIG. 4, the IC board 4 is placed on the board 9. The IC board 4 is provided at its one surface to be faced against the board 9 with a number of ball-like solders 5 made of conventional soldering material. The solders 5 are arrayed in the same manner as the lands 2 in the board 9. Preferably, each of the solders 5 is sized so that, when properly fused on the land 2, it could extend across the entire surface of the land 2 to the portion 3a of the wire 3. For this purpose, it is necessary for the IC board 4 to be assembled on the board 9 so that the ball-like solders 5 correspond to the associated lands 2 as shown in FIG. 4.

The assembled IC 4 and board 9 are placed in a heating chamber of a furnace, for example, re-flowing furnace. This causes the ball-like solder 5 as well as the soldering paste 10 to melt on the lands 2, electrically connecting the melted solder 5 with the associated circuit portion provided on the IC board 4. The resultant semiconductor module 8 is illustrated in FIG. 5.

Figure 5:
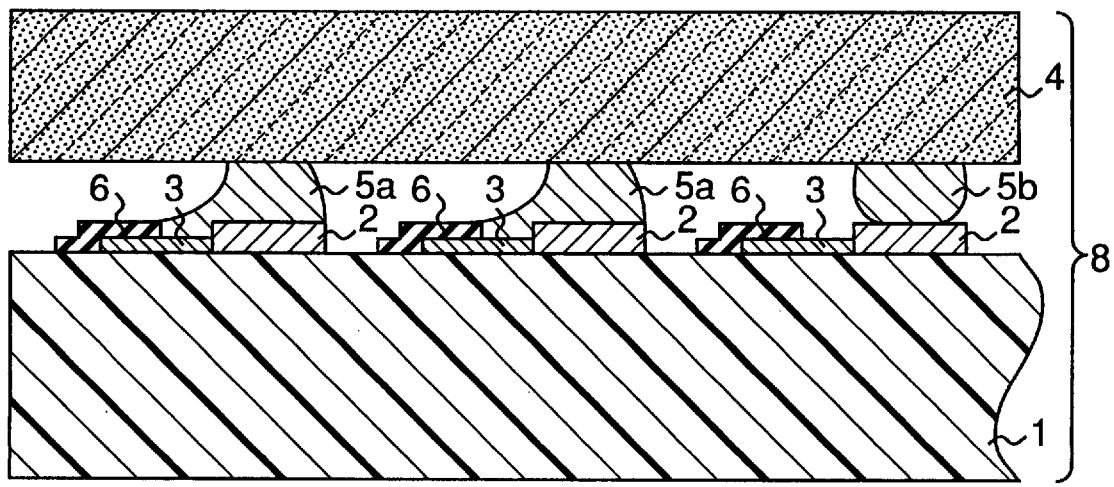

FIG. 5 also shows not only properly melted solders designated at 5a but also improperly melted solders designated at 5b. As can be seen in the drawing, the properly melted solder 5a covers not only on the entire surface of the land 2 but also on the portions 3a of the wire 3 in the opening 7, due to a good affinity of between the land 2 and the wire 3, both made of the same material. On the other hand, the substrate 1 exposed outside the land 2 and the portion 3a of the wire 3 in the opening 7 is made of material capable of repelling against the melted solder 5a, preventing the melted solder 5a from flowing beyond the peripheral of the land 2 and the end portion 3a onto surface of the substrate 1.

On the other hand, the improperly melted solder 5b, since it has not completely melted, contacts only a part of the surface of the land 2 to form a space gap at its periphery and does not extend onto the portion 3a of the wire 3, which can result in a defect in the communication.

Figure 6:
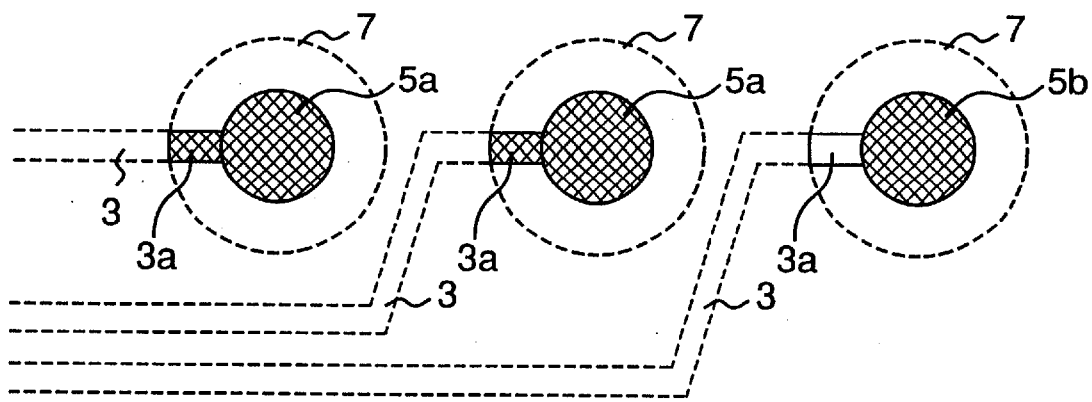
FIG. 6 is a photofluorographic top view showing the manufacturing process of the semiconductor module according to Embodiment 1 of the present invention.

Next, a process for determining whether the soldering has been made properly is described hereinafter. In this process, the quality of the soldering is determined by the conventional fluoroscoping using soft X-ray illuminated from above the semiconductor modulator 8. FIG. 6 shows in part a resultant photofluorographic image of the semiconductor module. For clarity, the melted solder is shown with a cross-hatching. The image clearly shows that the properly melted solder 5a extends onto the end portion 3a of the patterned wire 3 connected to the land 2. The image also shows that the improperly melted solder does not reach the end portion 3a. Therefore, whether the solder has been melted properly can be determined by viewing the existence of the melted solder on the end portion 3a even when the improperly melted solder would cover the entire surface of the land 2.

In view of above, by the use of the printed circuit board according to the first embodiment of the present invention, the soldering connection in the semiconductor module can easily be tested, which results in a highly reliable semiconductor module. Also, this allows the land to be reduced in size down to the melted solder, eliminating the space for the land 2 on the printed-circuit board 9. Advantageously, this in turn reduces the restrictions in the designing of the wires to be patterned. Also, a semiconductor module in which a greater number of ICs can be mounted in a small area can be provided. Further, the land can be in the form of circle corresponding to the ball-like solder, which allows the existing masks to be used and the mask to be aligned with great ease.

Embodiment 2

Figure 7:
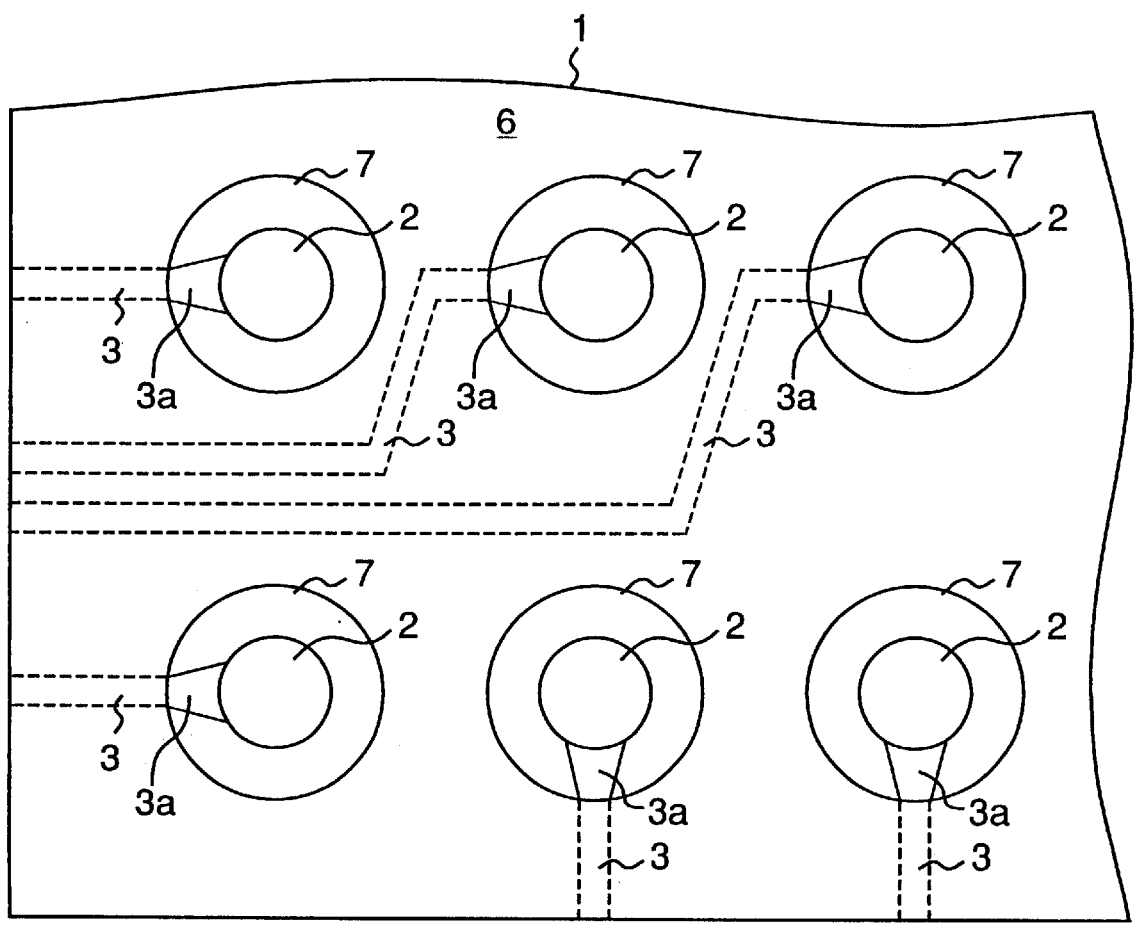
FIG. 7 is a top plan view of the printed-circuit board according to Embodiment 2 of the present invention.

Referring to FIG. 7, the semiconductor module 8 according to the second embodiment will be described. In this embodiment, particularly the end portion 3a of the patterned wire 3 is tapered away from the land 2, although it is designed to have a constant width in the first embodiment. Other parts or portions of the module are similar to those in the first embodiment and therefore no further description will be made thereto.

Figure 8:
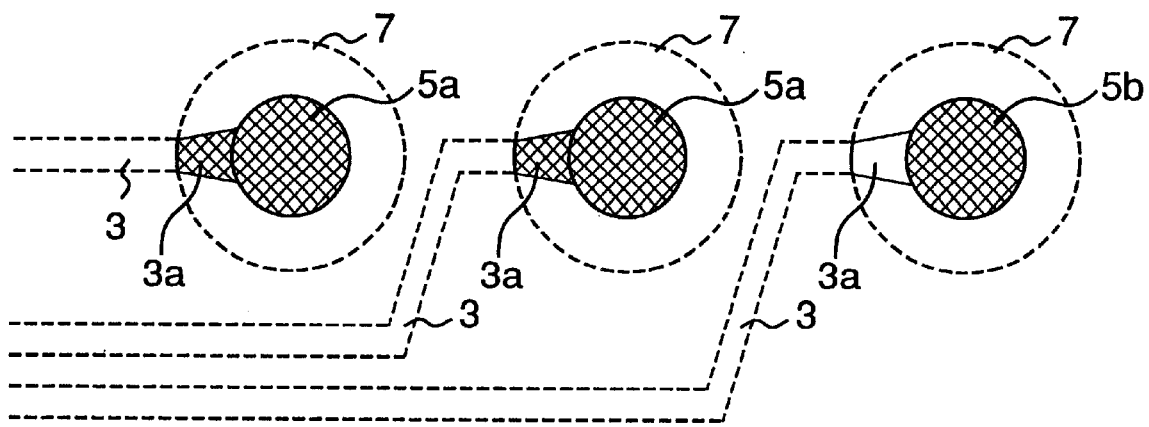
FIG. 8 is a photofluorographic top plan view showing the manufacturing process of the semiconductor module according to Embodiment 2 of the present invention.

With this arrangement, the melted solder can easily flow across the end portion 3a. This means that the properly melted solder extends more smoothly over the entire end portion 3a, causing the fluorographic image in which the melted solder on the end portion 3a can easily be identified as shown in FIG. 8. This eases the determination of the quality of the soldering connection.

The tapered end portion 3a also permits another portion of the wire 3 connected to the end portion 3a to be narrowed. On the other hand, the end portion 3a can be widened at its connecting end with the land 2. This reduces a required area for the wires on the circuit board to provide a high density semiconductor module without decreasing the viewability of the end portions 3a at the fluorographic inspection.

Embodiment 3

Figure 9:
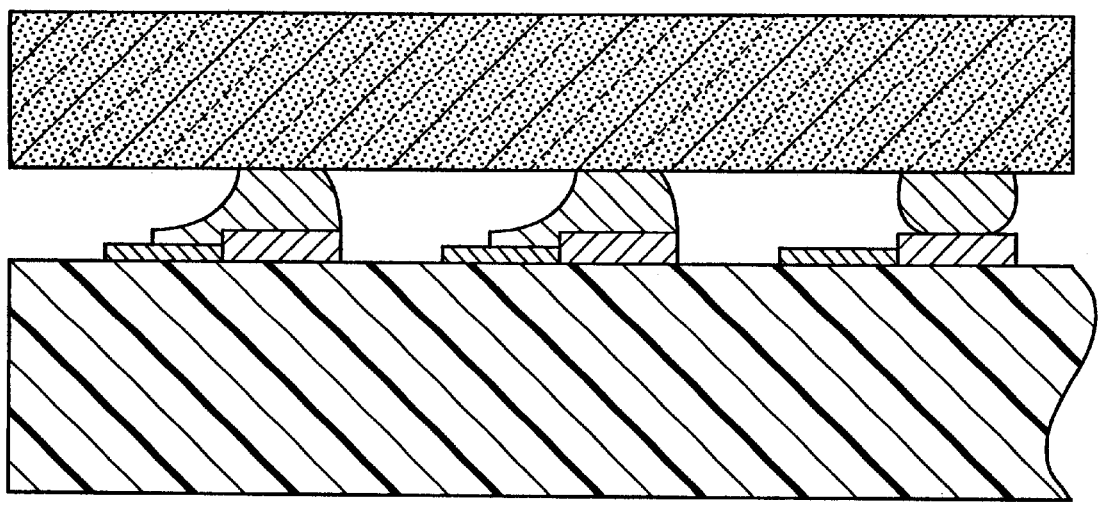
FIG. 9 is a cross sectional view showing the semiconductor module according to Embodiment 3 of the present invention.
Figure 10:
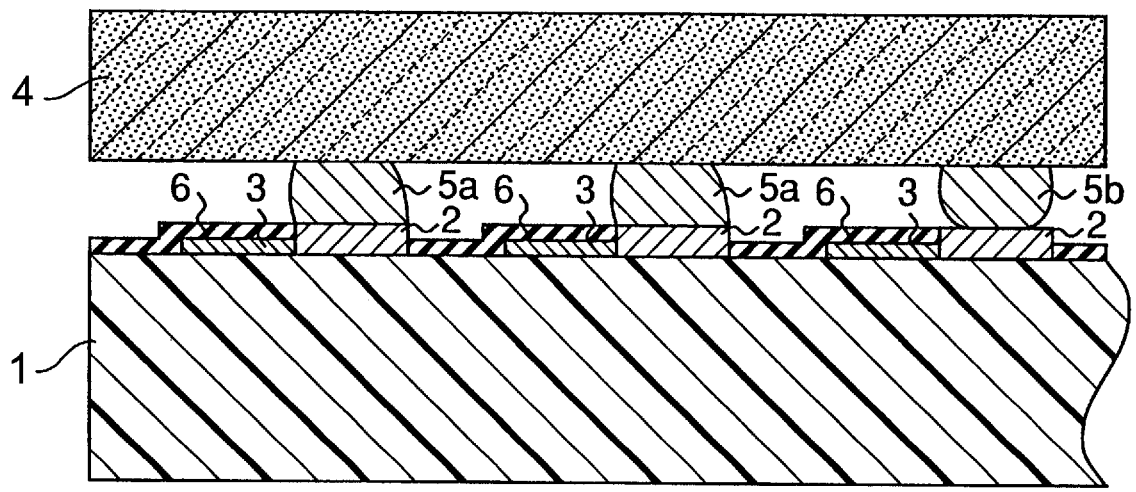
FIG. 10 is a cross sectional view showing the prior art semiconductor module.
Figure 11:
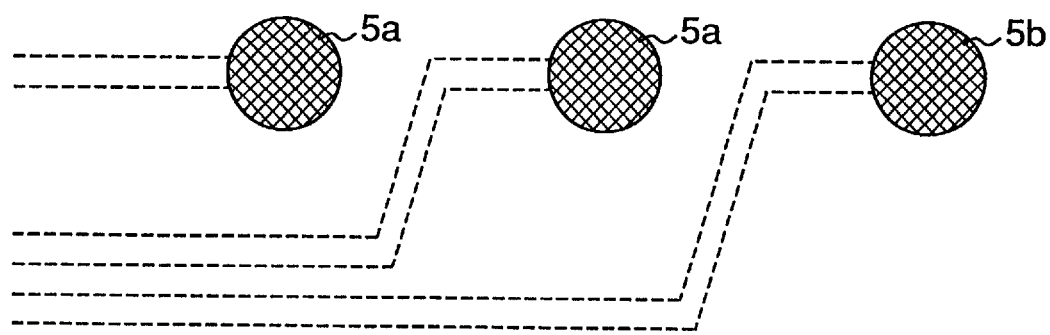
FIG. 11 is a cross sectional view showing the manufacturing process of the prior art semiconductor module.

According to the semiconductor module according to Embodiment 1 of the present invention, the photoresist layer 6 is still remained even after the IC board 4 has been mounted on the circuit substrate 1. Contrary to this, in a resultant semiconductor module according to Embodiment 3 shown in FIG. 9, no photoresist layer exists. Other parts or portions of the module are similar to those in the first embodiment and therefore no further description will be made thereto.

In order to produce the semiconductor module of Embodiment 3, an additional process is needed for the removal of the photoresist layer. For example, the additional process includes a step for bathing the semiconductor module into the organic solvent for removing the photoresist layer after the refolwing step.

The semiconductor module so constructed eases the inspection of the quality of the soldered connection and results in a highly reliable semiconductor module with a simple manner.

Modifications

Although the opening 7 in the substrate 1 is in the form of circle, it may be other configuration such as square and rectangular.

Also, the land 2 may be other configuration such as rectangular and circle with any deformation or deformations.

Further, the lands 2 and the patterned wires 3 may be made of the same or different materials, and they may have the same or different thicknesses.

Furthermore, the protection layer of photoresist 6 may be made of other materials such as polytetrafluoroethylene which can function as a mask for the melted solder.

In view of above, the print-circuit board of the present invention can easily be tested for determining its soldering quality, and also can receive a number of ICs in high density.

Also, a highly reliable semiconductor module with a high density ICs can be obtailed.

Further, a highly reliable semiconductor module can be provided with the simple process.

PARTS LIST

1: circuit substrate
2: land
3: patterned wire
3a: end portion of patterned wire
4: semiconductor integrated circuit
5: ball-like solder
5a: proper soldering
5b: improper soldering
6: photoresist layer
7: opening of photoresist layer
8: semiconductor module
9: printed-circuit board
10: solder paste layer

What is claimed is:

1. A printed-circuit board, comprising:

a circuit substrate;

a plurality of patterned wires formed on a surface of said circuit substrate;

a plurality of lands, each land connected to at least one of said patterned wires through an end portion thereof; and a protection layer with a plurality of openings, covering the surface of said circuit substrate, wherein each of said plurality of openings in said protection layer exposes a corresponding land and is substantially larger than said corresponding land so as to be spaced away from the entire periphery of said corresponding land and expose the end portion of the patterned wire connected to said corresponding land and a peripheral portion on the periphery of said corresponding land, and at least one end portion exposed by a corresponding opening in said protection layer is located beneath a semiconductor integrated circuit to be connected with said circuit substrate.

2. A printed-circuit board according to claim 1, wherein each of the end portions of said patterned wires is tapered away from one of said lands connected thereto.

3. A semiconductor module, comprising:

a printed-circuit board, including
- a circuit substrate,
- a plurality of patterned wires formed on a surface of said circuit substrate,
- a plurality of lands, each land connected to at least one of said patterned wires through an end portion thereof, and
- a protection layer with a plurality of openings, covering the surface of said circuit substrate, each of said plurality of openings exposing a corresponding land and being substantially larger than said corresponding land so as to be spaced away from the entire periphery of said corresponding land and expose the end portion of the patterned wire connected to said corresponding land and a peripheral portion on the periphery of said corresponding land; and
- a plurality of ball-like solders formed on said plurality of lands to electrically connect said semiconductor integrated circuit to said printed-circuit board such that each of said ball-like solders is fused onto one of said lands and on the end portion of said patterned wires connected thereto, wherein at least one end portion is located beneath said semiconductor integrated circuit.

4. A semiconductor module according to claim 3, wherein each of the end portions of said patterned wires is tapered away from one of said lands connected thereto.

* * * * *